(12) United States Patent
Mathisen et al.

(10) Patent No.: US 10,822,906 B2
(45) Date of Patent: Nov. 3, 2020

(54) SUBSEA ELECTRIC POWER AND COMMUNICATION MODULE

(71) Applicant: FMC Kongsberg Subsea AS, Kongsberg (NO)

(72) Inventors: Stig Fredrik Mathisen, Kongsberg (NO); Heyn Halfdan Magnus, Kongsberg (NO); Vidar Nicolaysen, Kongsberg (NO); Egil Mulstad Skrivervik, Krogstadelva (NO)

(73) Assignee: FMC Kongsberg Subsea AS, Kongsberg (NO)

( * ) Notice: Subject to any disclaimer, the term of this patent is extended or adjusted under 35 U.S.C. 154(b) by 0 days.

(21) Appl. No.: 16/617,467

(22) PCT Filed: Jun. 6, 2018

(86) PCT No.: PCT/EP2018/064911
§ 371 (c)(1),
(2) Date: Nov. 26, 2019

(87) PCT Pub. No.: WO2018/228890
PCT Pub. Date: Dec. 20, 2018

(65) Prior Publication Data
US 2020/0182003 A1 Jun. 11, 2020

(30) Foreign Application Priority Data
Jun. 14, 2017 (NO) .................................. 20170965

(51) Int. Cl.
*E21B 33/035* (2006.01)
*H01R 13/523* (2006.01)
(Continued)

(52) U.S. Cl.
CPC ....... *E21B 33/0355* (2013.01); *H01R 13/523* (2013.01); *H05K 5/0017* (2013.01);
(Continued)

(58) Field of Classification Search
CPC . E21B 33/035; E21B 33/0385; H01R 13/523; H05K 5/0017; H05K 5/0069; H05K 5/0247; H05K 5/04; H05K 7/14
See application file for complete search history.

(56) References Cited

U.S. PATENT DOCUMENTS 4,485,398 A * 11/1984 Chapin, Jr. ............ H04N 5/232
348/333.01
5,491,300 A    2/1996 Huppenthal et al.
(Continued)

FOREIGN PATENT DOCUMENTS

EP      3 104 480 A1   12/2016
GB      2531033 A       4/2016
WO   WO 2013/028446 A1  2/2013

*Primary Examiner* — Abhishek M Rathod

(57) ABSTRACT

The present invention relates to a subsea electric power and communication module (10) for controlling a subsea module (2) of a subsea oil/gas installation (1). The module (10) comprises a housing (20), a first outer connector (30) provided outside of the housing (20), where the first outer connectors (30) is configured to be connected to a subsea module (2), and a control device (80) comprising electric power supply circuitry (80*a*) and/or communication circuitry (80*b*) 40*b* provided within the pressure sealed compartment (25). A penetrator device (50) is connected between the first outer connector (30) and the control device (80). The penetrator device (50) comprises a printed circuit board (51), a first sealing device (53) and a second sealing device (56) for sealing off a first area (A53) and a second area (A56) of the printed circuit board (51). The first area (A53) is faced towards the main compartment (25), while the second area (A56) is faced towards a pressure balanced compartment (46) between the pressure sealed main compartment (25) and an outside environment (OE) of the housing (20). A first inner connector (C80) is connected to the first area (A53) of the printed circuit board (51), where (Continued)

the first inner connector (C80) is further connected to the control device (80). A second inner connector (C3x) is connected to the second area (A56) of the printed circuit boar (51), where the second inner connector (C3x) is further connected to the outer connector (30). Conductive tracks (52a) are provided on the printed circuit board (51) between the first inner connector (C80) and the second inner connector (C3x).

9 Claims, 15 Drawing Sheets

(51) Int. Cl.
*H05K 5/00* (2006.01)
*H05K 5/02* (2006.01)
*H05K 5/04* (2006.01)

(52) U.S. Cl.
CPC ......... *H05K 5/0069* (2013.01); *H05K 5/0247* (2013.01); *H05K 5/04* (2013.01)

(56) References Cited

U.S. PATENT DOCUMENTS

| | | | |
|---|---|---|---|
| 6,778,389 B1* | 8/2004 | Glovatsky | H01L 25/065 |
| | | | 165/80.1 |
| 2006/0176677 A1* | 8/2006 | Glovatsky | H05K 1/144 |
| | | | 361/796 |
| 2009/0303687 A1 | 12/2009 | Davis | |
| 2013/0098628 A1* | 4/2013 | Van Wijk | E21B 33/0355 |
| | | | 166/368 |
| 2013/0286548 A1* | 10/2013 | Andrea | H01H 69/00 |
| | | | 361/603 |
| 2014/0197532 A1* | 7/2014 | Ide | H01L 23/36 |
| | | | 257/706 |
| 2014/0305656 A1 | 10/2014 | Salen et al. | |

* cited by examiner

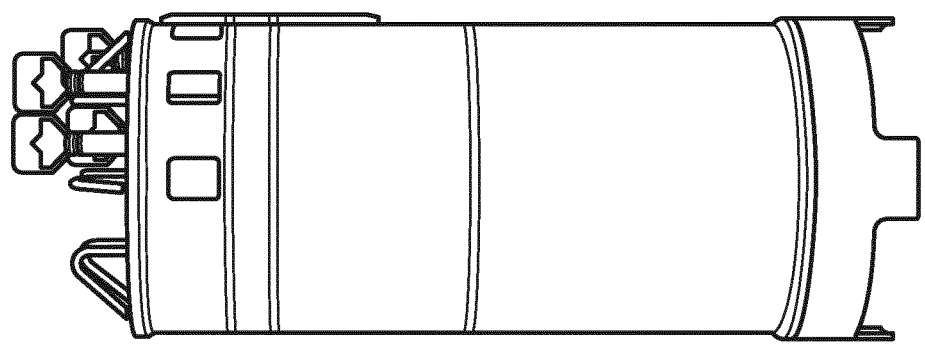
FIG. 2 (Prior Art) SCM and SRM mechanical solution
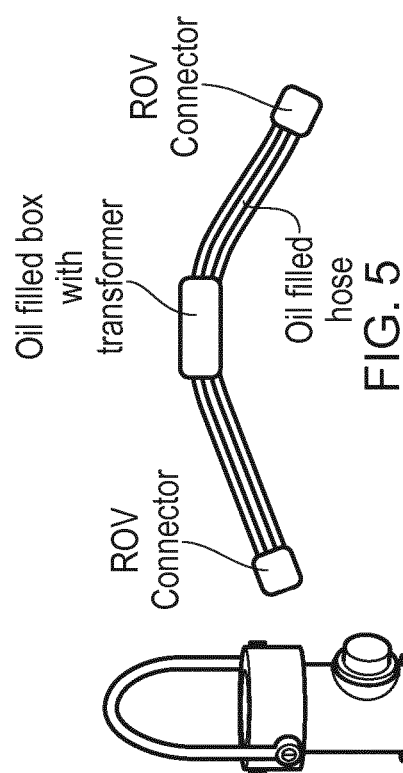
FIG. 5
ROV Connector
Oil filled box with transformer
Oil filled hose
ROV Connector
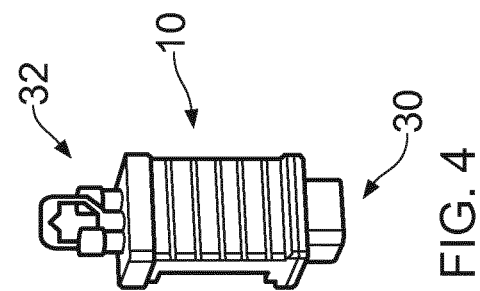
FIG. 4
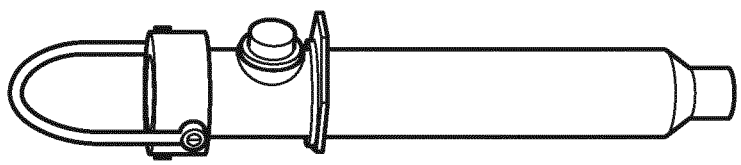
FIG. 3b (Prior Art) Power and communication modules
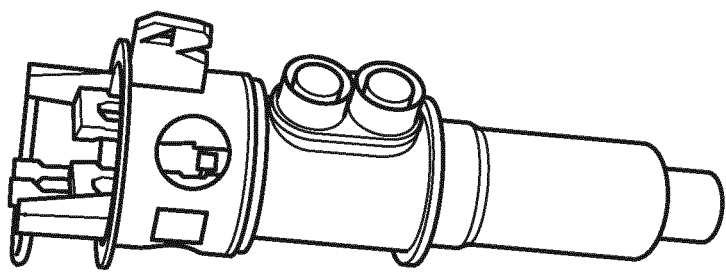
FIG. 3a (Prior Art) Power and communication modules

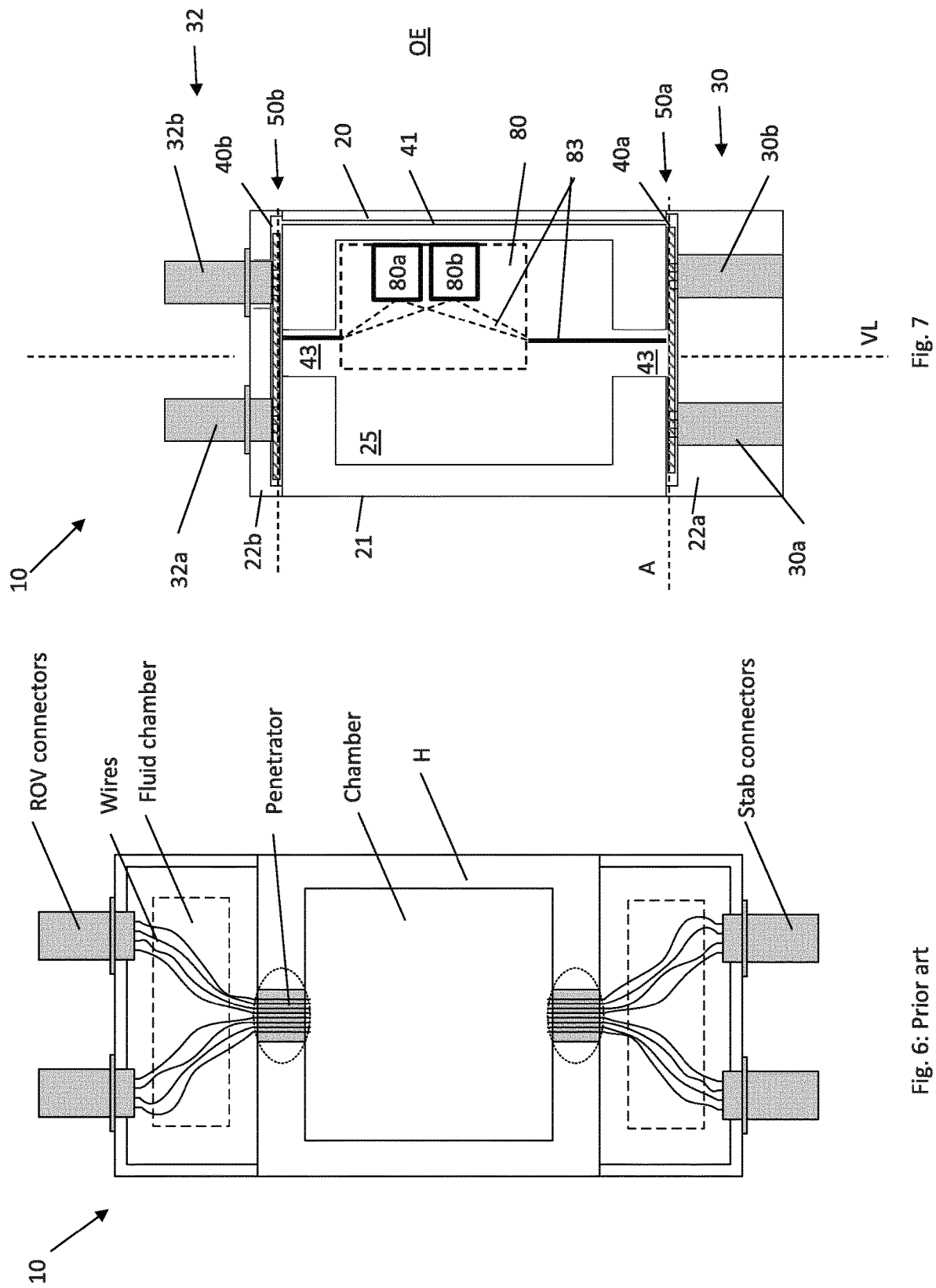

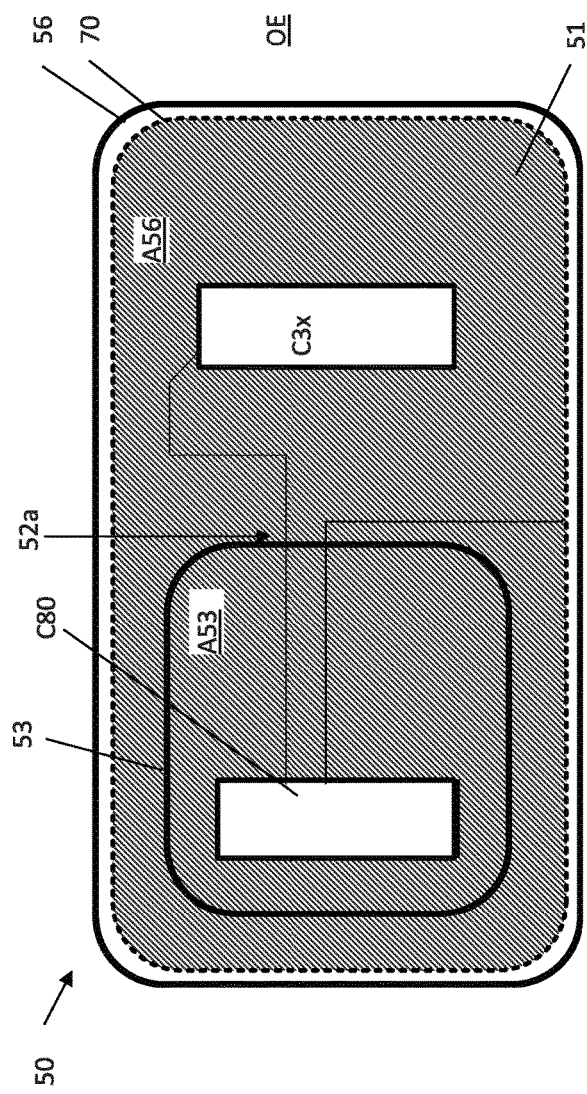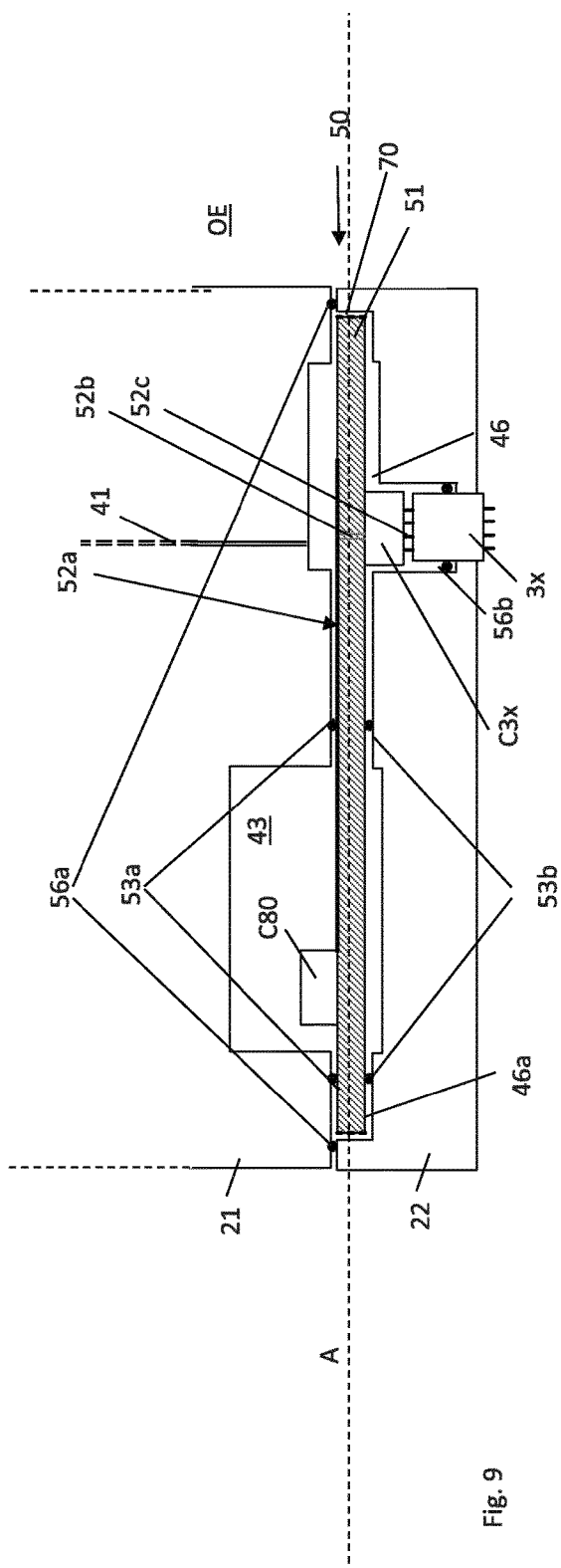

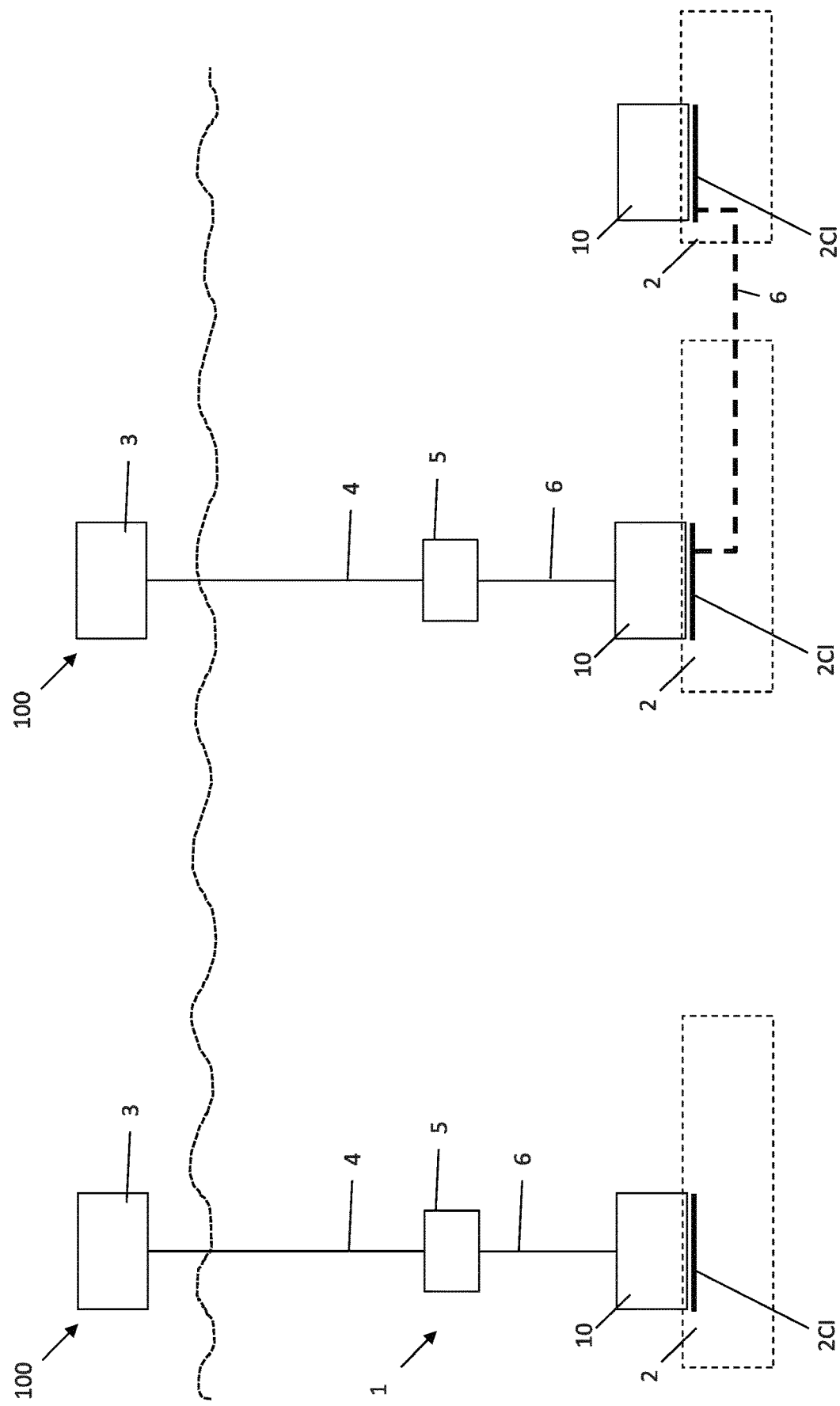

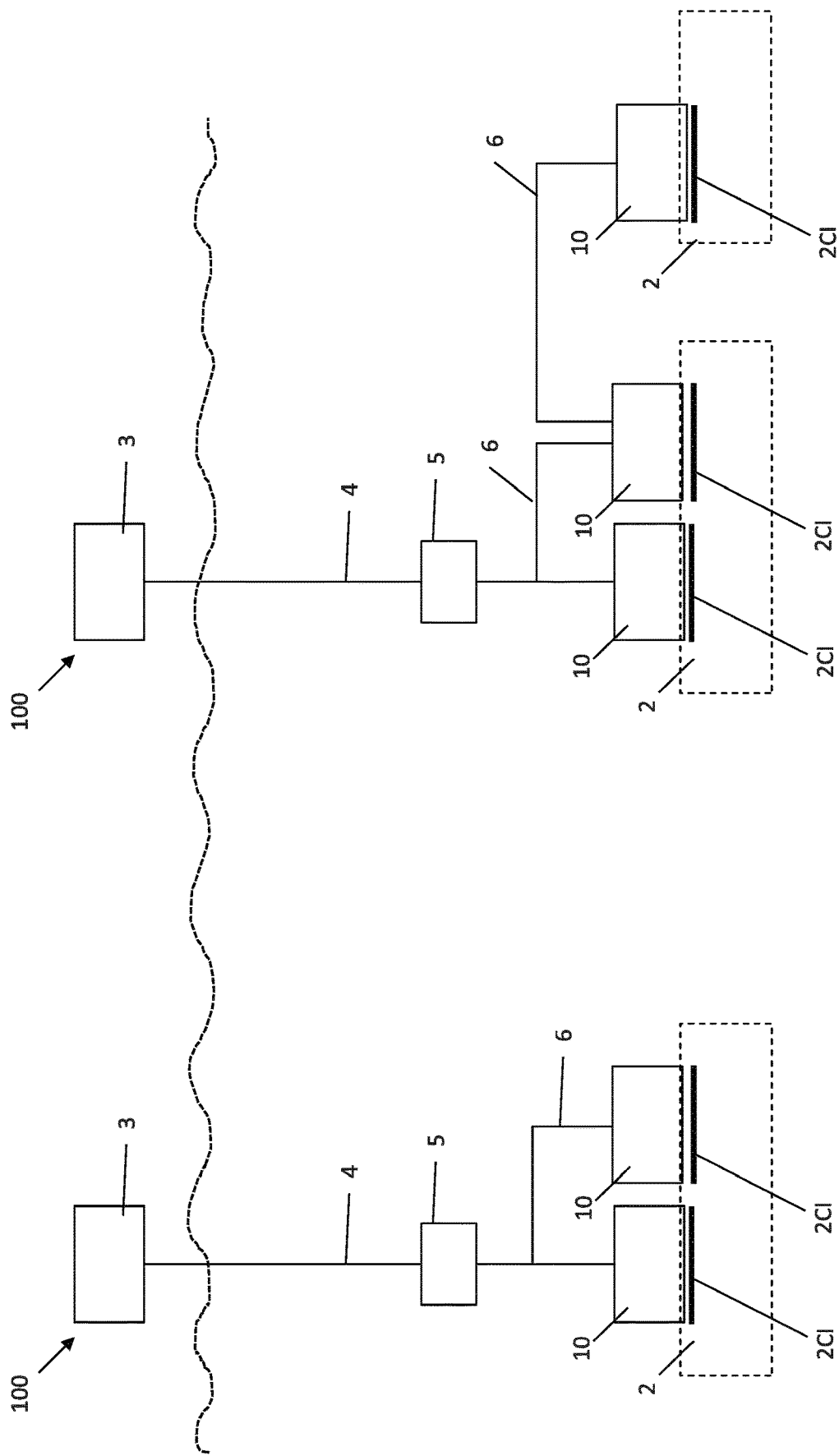

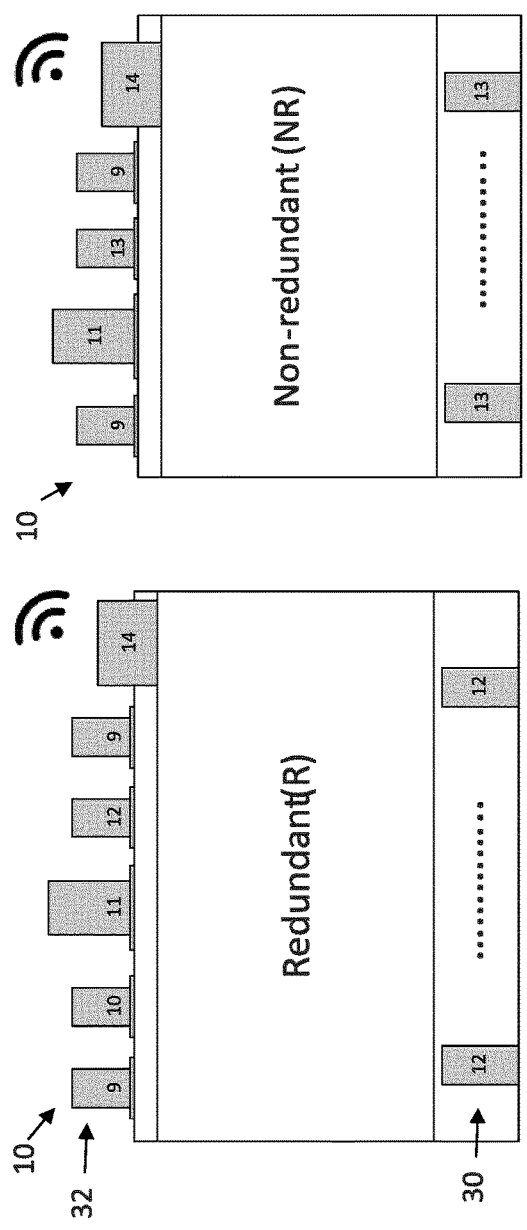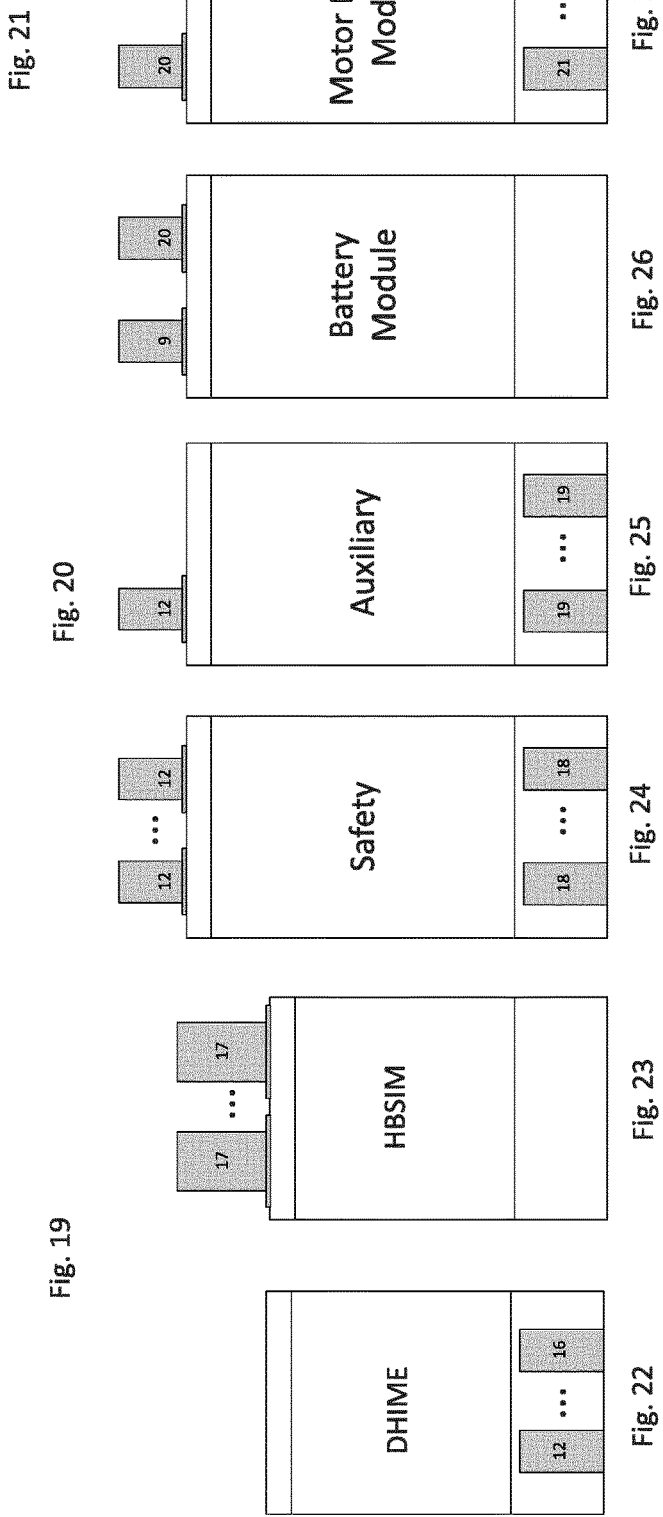

SUBSEA ELECTRIC POWER AND COMMUNICATION MODULE

FIELD OF THE INVENTION

The present invention relates to an electric power and communication module for controlling a subsea module of a subsea oil/gas installation. The present invention also relates to a control system for controlling such a subsea oil/gas installation and a method for installing a control system or for changing an existing control system of such a subsea oil/gas installation.

BACKGROUND OF THE INVENTION

A subsea oil and/or gas installation typically comprises a number of subsea modules, such as subsea manifolds, Christmas trees connected to their respective well heads, etc. These subsea modules are connected to a topside (offshore or landbased) control center for transferring electric power and communication signals between the subsea modules and the topside via an umbilical.

In FIG. 1, a subsea installation 1 is shown with a subsea module 2 in the form of a Christmas tree and an umbilical termination assembly UTA. A subsea control module (SCM) is also shown. Different types of jumpers (hydraulic/chemical and electric) are connected between the umbilical termination assembly and the SCM either directly or via the subsea module 2.

The subsea control module (SCM) shown in FIG. 2 has been manufactured and sold by FMC Technologies for many years. The SCM contains electronics, instrumentation, and hydraulics for safe and efficient operation of subsea tree valves, chokes, and also downhole valves in the well. The SCM comprises lower stab connectors provided in the bottom of the SCM for lowering the SCM onto corresponding connectors provided on the subsea module. The SCM also comprises upper connectors for connection via cables to other subsea equipment. The SCM is large and heavy (approximately 1400-2000 kg, depending on its specification) and requires a wireline during lowering and elevating the SCM with respect to the subsea module.

Other such prior subsea control modules are shown in FIGS. 2 and 3. These control modules do not transfer hydraulic control fluid to the subsea module, they only transfer electric power and communication signals. Also here a wireline operation is required during lowering and elevating, as their weight is approximately 200 kg in water.

It is now referred to FIG. 6, illustrating the internal structure of a prior art subsea control module schematically. Here it is shown that the control module comprises a housing H, upper ROV connectors for connection to subsea cables (connection/disconnection performed by means of ROV), lower stab connectors for connection to the subsea module (described above), a 1 atm chamber in which electronic components are provided, where the electronic components are connected to the upper and lower connectors via wires and a penetrator (for example a glass to metal penetrator). The wires are provided in a pressure balanced fluid chamber, into which transformers also are located.

One object of the present invention is to provide a subsea control module in the form of an electric power and communication module for controlling a subsea module of a subsea oil/gas installation that can be elevated and lowered by means of a ROV. This requires the weight of the module to be less than 100 kg in water, or less than 130 kg in air.

To achieve this, one object is to reduce the physical size and thereby the weight of the control module.

Another object of the present invention is to simplify the control module and at the same time to improve the flexibility of the control module.

Another object of the present invention is to ease the manufacturing process of such control modules.

Another object is to improve the heat transfer from the electronic components within such a control module.

Another object is a design and product platform that enables most of the engineering work for the modules to be performed in an early phase. Hence, the operator of a oil and/or gas field may order control modules (together with other equipment) from a number of alternatives. In this way, most of the project engineering required in the industry today can be eliminated.

Another object is to remove manual wiring and soldering of electric cables inside the control module.

SUMMARY OF THE INVENTION

The present invention relates to a subsea electric power and communication module for controlling a subsea module of a subsea oil/gas installation, where the module comprises:
 a housing comprising a pressure sealed main compartment;
 a first outer connector provided outside of the housing, where the first outer connectors is configured to be connected to a subsea module;
 a control device comprising electric power supply circuitry and/or communication circuitry provided within the pressure sealed compartment;
 a penetrator device connected between the first outer connector and the control device;
 characterized in that the penetrator device comprises:
 a printed circuit board;
 a first sealing device for sealing off a first area of the printed circuit board, where the first area is faced towards the main compartment;
 a first inner connector connected to the first area of the printed circuit board, where the first inner connector is further connected to the control device;
 a second sealing device for sealing off a second area of the printed circuit board, where the second area is faced towards a pressure balanced compartment between the pressure sealed main compartment and an outside environment of the housing;
 a second inner connector connected to the second area of the printed circuit board, where the second inner connector is further connected to the outer connector;
 conductive tracks provided on the printed circuit board between the first inner connector and the second inner connector.

The first and/or second inner connectors may be connector units electrically connected to the printed circuit board.

Alternatively, the first and/or second inner connectors comprises a press-fit connection interface electrically connected to and integrated in the printed circuit board. As the respective areas are faced towards their respective compartments, the outer connector and the control device can be connected to their inner connectors without any soldering or manual wiring. In one aspect, the housing comprises a main housing unit and a connector housing unit;
 the penetrator device is provided in a compartment between the main housing unit and the connector housing unit;

the outer connector is provided through the connector housing unit.

In one aspect, the main housing unit is made of aluminum or an aluminum alloy.

In one aspect, the subsea control module comprises:
a first penetrator device connected between the first outer connector and the control device;
a second penetrator device connected between a second outer connector and the control device;
a pressure alignment channel provided through the housing between the pressure balanced compartment of the first penetrator device and the pressure balanced compartment of the second penetrator device.

In one aspect, the penetrator device comprises a leakage sensor provided in the pressure balanced compartment, where the leakage sensor is electrically connected to the control device.

In one aspect, the penetrator device comprises:
a first intermediate sealing device for sealing off a first intermediate area of the printed circuit board outside of the first area, where the first intermediate area is faced towards a first intermediate compartment forming an additional barrier between the pressure sealed main compartment and the outside environment;
a pressure sensor for sensing the pressure in the first intermediate compartment, where the pressure sensor is electrically connected to the control device.

In one aspect, the penetrator device comprises:
a second intermediate sealing device for sealing off a second intermediate area of the printed circuit board outside of the second area, where the second intermediate area is faced towards a second intermediate compartment forming an additional barrier between the pressure sealed main compartment and the outside environment.

The present invention also relates to a control system for controlling a subsea module of a subsea oil/gas installation, comprising:
a connection interface provided on the subsea module;
a topside control module;
an umbilical connected between the topside control module and the connection interface;
a subsea electric power and communication module according to claim 1 releasably connected to the connection interface.

In one aspect, the control system is comprising a further subsea module having a further connection interface;
a further subsea electric power and communication module connected to the further connection interface;
where the subsea electric power and communication module is connected to the further subsea electric power and communication module for providing communication between the topside control module and the further subsea electric power and communication module via the subsea electric power and communication module.

According to the invention it is achieved a subsea electric power and communication module (control module) for controlling a subsea module of a subsea oil/gas installation, where the weight of the module is min 20 and max 90 kg in water Accordingly, the module can be elevated and lowered by means of a ROV.

Moreover, the design and components within the control module 10 are standardized. Hence, some subsea modules may require only such control module, where the one control module provides a sufficient amount of electrical power and communication bandwidth for the subsea module. Other subsea modules may require more bandwidth and/or more electrical power. In such a case, an additional control module may be connected to this other subsea module.

Redundancy may be provided within one such control module, i.e. there are two independent control circuits within one such module. Alternatively, redundancy may be provided by having two independent control circuits in two separate control modules. If one of the control modules fails, it can be changed relatively fast by means of a ROV, as the standardized design allows such control modules to be stored.

The present invention also relates to a penetrator device for electrically connecting a first electric connector provided in a first compartment with a second electric conductor provided in a second compartment, where the penetrator device comprises:
a printed circuit board;
a first sealing device for sealing off a first area of the printed circuit board, where the first area is faced towards the first compartment and where the first electric connector is connected to the first area of the printed circuit board;
a second sealing device for sealing off a second area of the printed circuit board, where the second area is faced towards the second compartment; where the second connector is connected to the second area of the printed circuit board;
conductive tracks provided on the printed circuit board between the first connector and the second connector.

The first and second compartments are separate from each other.

DETAILED DESCRIPTION

Embodiments of the invention will now be described with reference to the enclosed drawings, where:

FIG. 2 illustrates a side view of a prior art subsea control module;

FIGS. 3a and 3b illustrates side views of prior art power and communication modules;

FIG. 4 illustrates a side view of a control module according to the present invention;

FIG. 5 illustrates a cable into which a transformer is integrated;

FIG. 6 illustrates the principal structure of a prior art control module schematically;

FIG. 7 illustrates the principal structure of the control module of FIG. 4;

FIG. 8 illustrates a top view of the printed circuit board with internal and external connectors as used in FIG. 7;

FIG. 9 illustrates a cross sectional side view of the printed circuit board and connectors of FIG. 8;

FIG. 12-17 illustrate different embodiments of a control system according to the invention;

FIGS. 19 and 20 illustrate outer connectors of two embodiments of the control module;

FIG. 21-27 illustrate auxiliary modules for connection to the control module;

Figure 1:
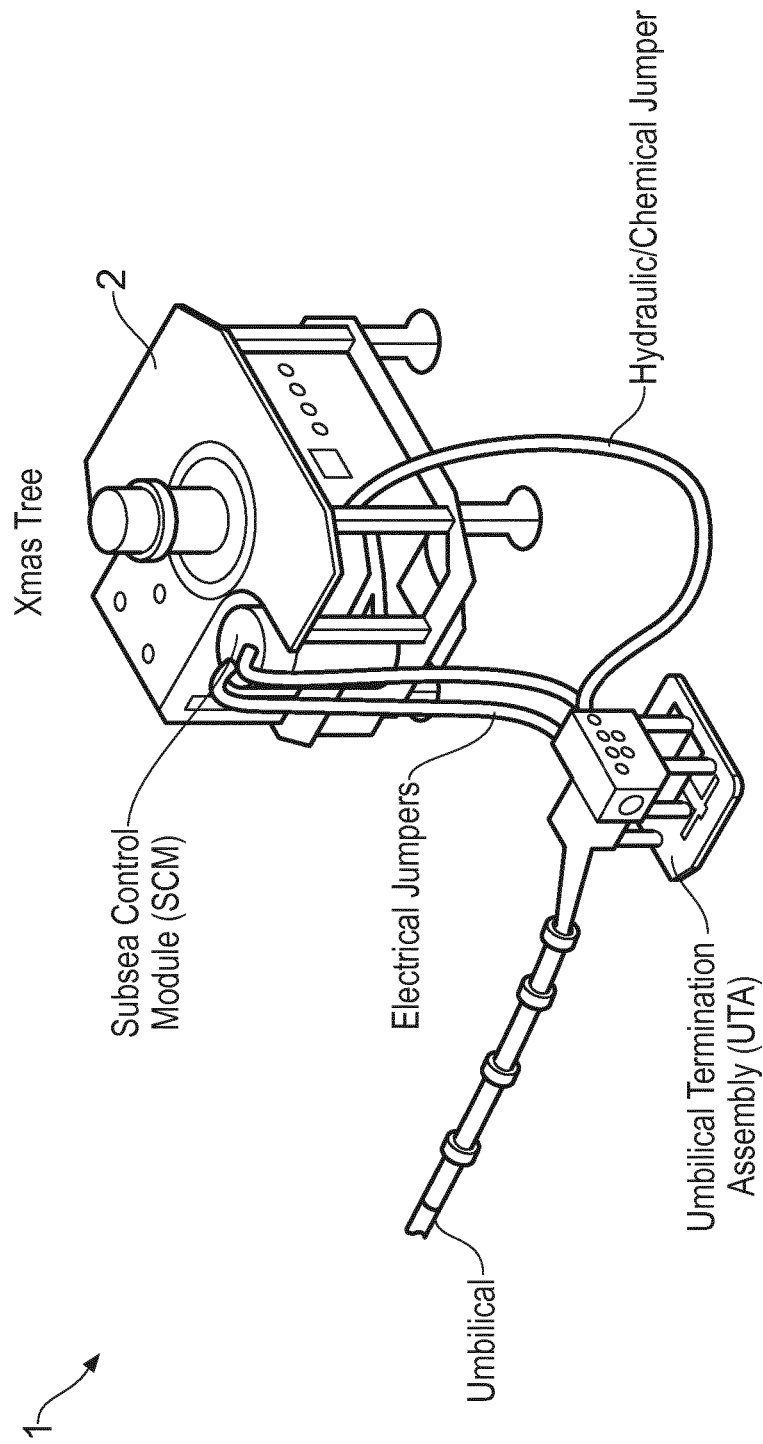
FIG. 1 illustrates a part of a prior art oil/gas installation.

The term "penetrator device" is used herein to describe a device which serves the purpose of electrically connecting a first electric conductor with a second electric conductor, while at the same time separating the pressure surrounding the first conductor from the pressure surrounding the second conductor.

It is now referred to FIG. 12. Here, a subsea control system 100 with a subsea electric power and communication module 10 is shown. The electric power and communication module 10 is hereinafter referred to as a "control module" 10. The control module 10 is connected to a connection interface 2CI of a subsea module 2. The subsea module 2 can be a manifold unit, a Christmas tree unit, a subsea umbilical termination unit, an electrical distribution module (EDM), a pipeline end manifold unit (PLEM), a boosting station, a riser base unit and other subsea modules which needs a supply of electric power and/or needs to send sensor signals.

The control module 10 is also connected to a topside control module 3 via an umbilical 4. In a typical subsea installation 1, the umbilical 4 is terminated in an umbilical termination unit 5 and a jumper 6 is connected between the control module 10 and the umbilical termination unit 5. It should be noted that the jumper 6 may be connected directly to the control module 10 or the jumper 6 may be connected to the control module 10 via the connection interface 2CI of the subsea module 2.

The control module 10 provides two main purposes. First, the control module 10 controls the supply of electric energy to the subsea module 2 and/or to further subsea modules 2. Electric energy is supplied to the control module 10 from the topside control module 3 via the umbilical 4. Alternatively, electric energy is supplied to the control module 10 from a subsea power source, for example a subsea battery. The control module 10 therefore comprises control circuitry to turn on or turn off the electric power supplied to the subsea module 2 or the further subsea modules 2. This will be described further in detail below.

Secondly, the control module 10 provides communication between the topside control module 3 and the subsea module 2. The control module 10 may also provide communication with further subsea modules 2 or further control modules 10 connected to the same subsea module 10 or connected to further subsea modules 2.

The control module 10 therefore comprises communication circuitry. This will also be described further in detail below.

It is now referred to FIG. 7, FIG. 8 and FIG. 9. The control module 10 comprises a housing 20 comprising a pressure sealed main compartment 25 in which a control device is generally indicated as a dashed box 80. The outside environment of the housing is indicated as OE in FIG. 7.

The housing 20 comprises a main housing unit 21 and a connector housing 22. In the present embodiment, the housing 20 comprises a lower connector housing unit 22a connected to the lower end of the main housing unit 21 and an upper connector housing unit 22b connected to the upper end of the main housing unit 21.

The control module 10 further comprises a first outer connector 30 provided on the outside of the housing 20. In the present embodiment, the first outer connector 30 is provided on the lower side of the lower connector housing unit 22a. The first outer connector 30 is preferably a stab connector, which is connected to the connection interface 2CI of the subsea module 2 when the control module 10 is lowered onto the connection interface 2CI.

The control module 10 further comprises a second outer connector 32 provided on the outside of the housing 20. In the present embodiment, the second outer connector 32 is provided on the upper side or top side of the upper connector housing unit 22b. Alternatively, the second outer connector 32 can be provided on one of the side surfaces of the housing 20. The second outer connector 32 is preferably a ROV connector, where a ROV is used to connect one end of the jumper 6 in FIG. 12 (also shown in FIG. 1 or FIG. 5) to the ROV connector. The second end of the jumper may be connected to the subsea module 2, to a further subsea module 2 or to a further control module 10.

In FIG. 7 it is shown that the lower outer connector 30 comprises two outer connectors 30a, 30b. In FIG. 7 it is also shown that the upper outer connector 32 comprises two outer connectors 32a, 32b. It should be noted that the outer connectors 30, 32 each may comprise more than two such connectors. Some of the connectors may be electrical connectors for transferring electric energy to the control module 10, other connectors may be electrical connectors for transferring electric energy from the control module 10, other connectors may be communication connectors for transferring communication signals. Typically one connector may comprise a plurality of connection pins, typically 4 or 12, where some pins are used for electrical power in/out and some pins are used for communication.

A lower penetrator device 50a is provided in a compartment 40a between the main housing unit 21 and the lower connector housing unit 22a. The control circuit 80 is connected to the first outer connector 30 via the lower penetrator device 50a. A corresponding upper penetrator device 50b is provided in a compartment 40b between the main housing unit 21 and the upper connector housing unit 22b. The control circuit 80 is connected to the second outer connector 32 via the upper penetrator device 50b. Preferably, the size and design of the lower penetrator device 50a is equal to the upper penetrator device 50b. However, the number of connectors and pins per connector may be different. Moreover, as described below, only one of the penetrator devices needs a pressure sensor 72 due to the pressure alignment channel 41b (see FIG. 11).

As shown in FIG. 7, the control device 80 comprises electric power supply circuitry 80a and communication circuitry 80b. As described above, the electric power supply circuitry 80a receives electrical energy via one or some of the connectors 30, 32 and distributes electrical energy via some of the other connectors 30, 32. The communication circuitry 80b provides communication between the control module 10 and the subsea module 2, the topside control module 3, further control modules 10 and/or further modules 2. The control device 80 may for example turn on or off the supply of electric energy to a specific part (for example an electric motor or an electric valve) of the module 2 based on a control signal given by a person of a user interface connected to the topside control module 3 or based on a control signal received from a sensor in the module 2.

It should be mentioned that the module 10 performs measurements of currents and voltages into and out of the module. These measurements are logged for safety reasons, for power management etc.

Preferably, the main housing unit 21 is formed as two bodies made of a preferably metallic material, where the pressure sealed main compartment 25 is provided as a cavity in one of or in both bodies. Preferably, the main housing unit 21 and connector housing units 22 are made of aluminum or an aluminum alloy.

As shown in FIG. 7, upper and lower bores 43 are provided from the upper and lower ends of the main housing unit 21 to the main compartment 25. These bores 43 are used during manufacturing to insert the components of the control circuit 80 into the main compartment 25. Connection wires 83 between the control circuit 80 and the penetrator devices 50 are also located in these bores 43. It should be noted that the upper and lower bores 43 are considered to be a part of the pressure sealed main compartment 25.

A vertical center line VL is indicated in FIG. 7. The stab connectors 30 are provided in parallel with this vertical center line VL, and hence, the control module 10 is lowered parallel to this vertical center line VL when being connected to the connection interface 2CI of the subsea module 2. As is known for the skilled person, the connection interface 2CI may comprise guiding means for guiding the connectors connector into its correct position.

It is now referred to FIGS. 8 and 9, where the penetrator device 50 is shown. The penetrator device 50 may be the lower penetrator device 50a or the upper penetrator device 50b. In FIG. 8, 9 the connector is therefore indicated as 3x, implying that the connector can be either the connector 30 or the connector 32.

The penetrator device 50 comprises a printed circuit board 51 indicated as a hatched box in FIGS. 8a and 9. Two connectors C80 and C3x are connected to the printed circuit board 51 at a distance from each other. These two connectors C80 and C3x are referred to as "inner connectors" as they are provided within the housing 20, contrary to the abovementioned outer connectors 30, 32. The two connectors C80 and C3x are connected to each other by means of conductive tracks 52a provided on the printed circuit board 51 between the first inner connector C80 and the second inner connector.

The printed circuit board 51 has a planar surface A, which preferably is oriented perpendicular to the vertical center line VL.

It should be noted that FIG. 8 only specifies the relative positioning between the two inner connectors C80 and C3x. Preferably, as shown in FIG. 9, the two inner connectors C80 and C3x are connected to opposite side surfaces of the printed circuit board 51, therefore conductive pins or wires 52a are provided between the opposite side surfaces of the printed circuit board 51. However, it would also be possible to connect the two inner connectors C80 and C3x to the same side surface, by providing suitable conductive pins or wires through the printed circuit board 51.

The first inner connector C80 is connected to the control device 80 via the wires 83 through the bore 43.

The second inner connector C3x is connected to the outer connector 3x via connector pins 52c. Alternatively, wires could be used.

The penetrator device 50 further comprises first and second sealing devices 53, 56.

The first sealing device 53 is sealing off a first area A53 of the printed circuit board 51. The first sealing area A53 is faced towards the main compartment 25. More specifically, the first area A53 is faced towards the bore 43 of the main compartment 25. The first inner connector C80 is connected to the first area A53 of the printed circuit board 51.

The first sealing device 53 comprises a first sealing element 53a provided between the main housing unit 21 and the printed circuit board 51 and a second sealing element 53b provided between the printed circuit board 51 and the connector housing unit 22.

The second sealing device 56 is sealing off a second area A56 of the printed circuit board 51. The second sealing area A56 is faced towards a pressure balanced compartment 46 between the pressure sealed main compartment 25 and the outside environment OE of the housing 20. The second inner connector C3x is connected to the second area A56 of the printed circuit board 51. It should be noted that the compartment 46 is in contact with the second area A56 of the printed circuit board 51, i.e. around and outside of the first sealing device 53. Hence, the space between the first sealing device 53 and the second sealing device 56 to the left in FIG. 9 (indicated as 46a) is also a part of the compartment 46.

The second sealing device 56 comprises a first sealing element 56a provided between the main housing unit 21 and the connector housing unit 22 and a second sealing element 56b provided between the connector housing unit 22 and the connector 3x. Hence, in the preferred embodiment shown in FIG. 9, the second sealing device 56 is not in contact with the printed circuit board 51 itself.

As shown in FIG. 9, the outer connector 3x is protruding out through an opening in the connector housing unit 22, where the second sealing element 56b is provided around the outer connector 3x in the opening of the connector housing unit 22.

It should be noted that the second sealing device 56 is provided outside of the first sealing device 53, where the term outside here refers to that the second sealing device 56 is closer to the outside environment OE than the first sealing device 56. In the same way, the first sealing device 53 is provided inside of the second sealing device 56, where the term inside here refers to that the first sealing device 53 is closer to the main compartment 25 than the second sealing device 56. Hence, the first sealing device 53 provides an innermost barrier between the main compartment 25 and the outside environment OE, while the second sealing device 56 provides an outermost barrier between the main compartment 25 and the outside environment OE.

In the present embodiment, the pressure sealed compartment 25 is filled with a gas such as nitrogen gas ($N_2$) pressurized at 1 atm. The pressure balanced compartment 46 between the pressure sealed main compartment 25 and the outside environment OE of the housing 20 is filled with a liquid, typically a dielectric oil. The first and second sealing devices 53, 56 and the liquid-filled pressure balanced compartment 46 forms a pressure compensation system where it is obtained that the pressure inside the main compartment 25 is maintained at 1 atm when the device 10 is lowered from the topside to the seabed at depths from 50-3000 m below sea level, while at the same time compartment 46 is compensated to OE pressure level.

The penetrator device 50 further comprises a leakage sensor 70 provided in the pressure balanced compartment 46. In the embodiment of FIGS. 8 and 9, the leakage sensor 70 is indicated by a dashed line along the peripheral edge of the printed circuit board 51. Hence, the leakage sensor 70 is adjacent to the connection between the main housing unit 21 and the connector housing unit 22. Hence, if the first sealing element 56a of the second sealing device 56 is leaking, the leakage will be detected fast as the distance to the leakage sensor 70 is very short. The leakage sensor 70 may comprise one continuous sensor element or a number of leakage sensing elements located adjacent to each other around the peripheral edge. The leakage sensor 70 is electrically connected to the control device 80, for example via conductive tracks on the printed circuit board 51, the first inner connector C80 and wires 83 or via conductive tracks into the first area A53 and then a separate wire (not shown) connected directly between the conductive track and the control housing. If the control circuit 80 is receiving a signal from the leakage sensor 70 indicating that a leakage has occurred, then the control circuit 80 may communicate this further to the topside control unit 3. The leakage sensor 70 may for example be copper wire, where the impedance of the copper wire changes when it comes in contact with water.

As mentioned above, the control device 10 of the present embodiment comprises two such penetrator devices 50a, 50b, a first penetrator device 50a connected between the first outer connector 30 and the control device 80 and a second penetrator device 50b connected between the second outer connector 32 and the control device 80. Here, the first inner connector C80 of the first penetrator device 50a and the first inner connector C80 of the second penetrator device 50b will be provided in the respective bores 43 of the main compartment 25 and hence have the same pressure.

As shown in FIG. 7 and FIG. 9, a pressure alignment channel 41 is in the present embodiment provided through the housing 20 between the pressure balanced compartment 46 of the first penetrator device 50a and the pressure balanced compartment 46 of the second penetrator device 50b. Hence, these pressure balanced compartments 46 will also have the same pressure.

Figure 10:
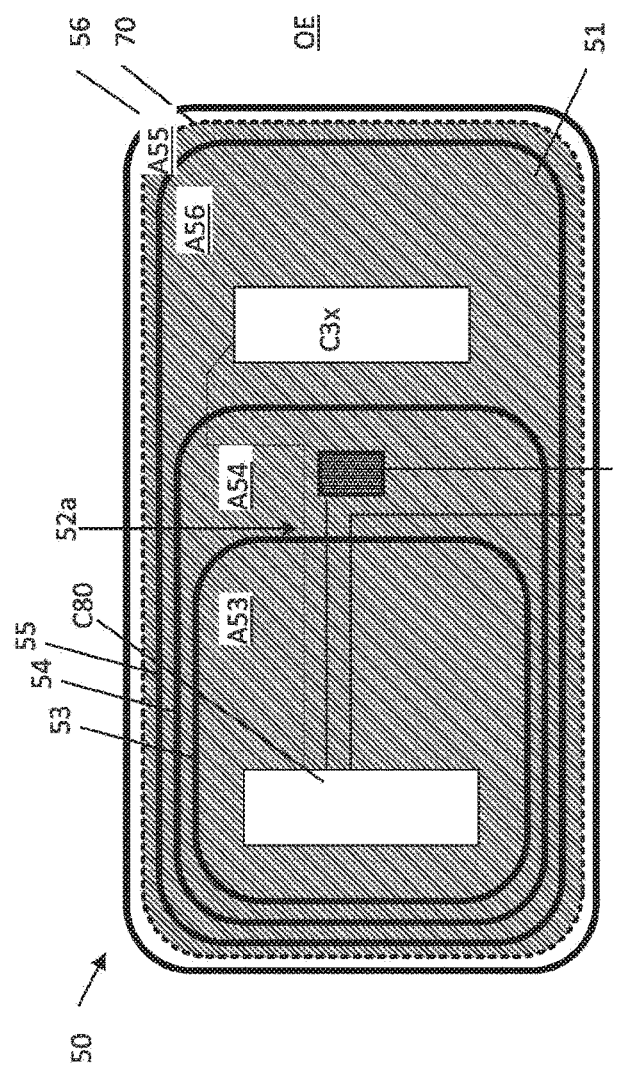
FIG. 10 illustrates a top view of an alternative embodiment of the printed circuit board with internal and external connectors.
Figure 11:
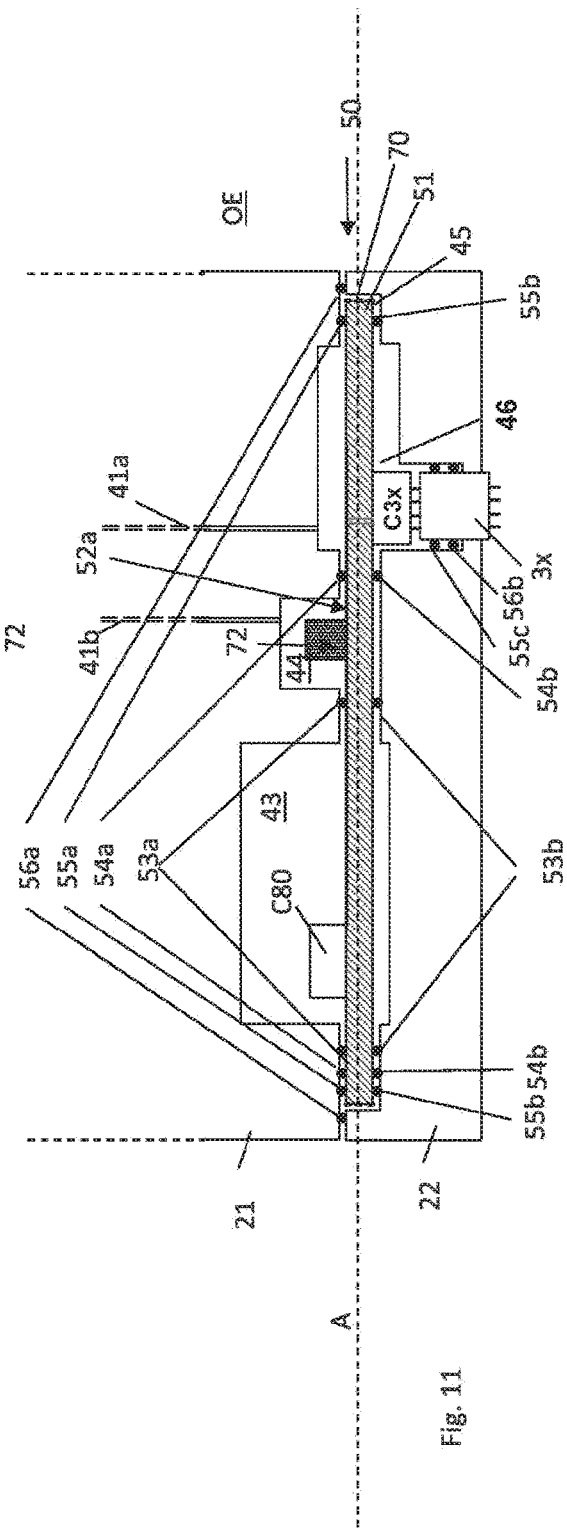
FIG. 11 illustrates a cross sectional side view of the printed circuit board and connectors of FIG. 10.

It is now referred to FIGS. 10 and 11 in which a second embodiment of the penetrator device 50 is shown. Also this second embodiment can be used as the first and second penetrator devices 50a, 50b. This embodiment of the penetrator device 50 is similar to the embodiment described above with reference to FIGS. 8 and 9, and only the differences will be described below.

In the embodiment of FIGS. 10 and 11, the penetrator device 50 comprises a first intermediate sealing device 54 for sealing off a first intermediate area A54 of the printed circuit board 51 outside of the first area A53, where the first intermediate area A54 is faced towards a first intermediate compartment 44 forming an additional barrier between the pressure sealed main compartment 25 and the outside environment OE. Hence, the first intermediate sealing device 54 provides a first intermediate barrier between the first and second sealing devices 53, 56.

Also the first intermediate sealing device 54 comprises a first sealing element 54a provided between the main housing unit 21 and the printed circuit board 51 and a second sealing element 54b provided between the printed circuit board 51 and the connector housing unit 22.

In the first intermediate compartment 44 a pressure sensor 72 is provided for sensing the pressure in the first intermediate compartment 44. Similar to the leakage sensor 70, the pressure sensor 72 is electrically connected to the control device 80. If an undesired pressure in the compartment 44 is measured by the pressure sensor 72, information about this is sent to the topside control module 3.

The penetrator device 50 further comprises a second intermediate sealing device 55 for sealing off a second intermediate area A55 of the printed circuit board 51 outside of the second area A56, where the second intermediate area A55 is faced towards a second intermediate compartment 45 forming an additional barrier between the pressure sealed main compartment 25 and the outside environment OE.

Also the second intermediate sealing device 55 comprises a first sealing element 55a provided between the main housing unit 21 and the printed circuit board 51 and a second sealing element 55b provided between the printed circuit board 51 and the connector housing unit 22. The second intermediate sealing device 55 further comprises a third sealing element 55c provided between the outer connector 3x and the connector housing unit 22.

With respect to FIG. 10, the innermost sealing element is the first sealing device 53. The first intermediate sealing device 54 is surrounding the first sealing device 53. The second intermediate sealing element 55 is surrounding the first intermediate sealing device 54. The second sealing device 56 is surrounding the second intermediate sealing element 55.

With respect to FIG. 10, the innermost area is the first area A53. The first intermediate area A54 is surrounding the first area A53, the second area A56 is surrounding the first intermediate area A54 while the second intermediate area A55 is surrounding the second area A56.

The first intermediate compartment 44 is an additional 1 atm. compartment filled with the same gas as the main compartment 25 and bores 43. The second intermediate compartment 45 is filled with a dielectric oil, similar to the compartment 46.

In FIG. 11, the pressure alignment channel 41 is indicated as channel 41a. In FIG. 11, a further pressure alignment channel 41b is indicated as a channel between the compartment 44 of the lower penetrator device and the compartment 44 of the upper penetrator device. Hence, these first intermediate compartments 44 will also have the same pressure. Hence, only one of the penetrator devices 50 needs a pressure sensor 72.

In the embodiment of FIGS. 8 and 9, there is one pressure compensated oil barrier, compartment 46, towards seawater.

In the embodiment of FIGS. 10 and 11, there are two pressure compensated oil barriers, compartments 46 and 45, towards seawater.

It is now referred to FIG. 13, illustrating an alternative embodiment of the control system 100 shown in FIG. 12. Here, the oil and/or gas installation 1 comprises a further subsea module 2 shown to the right of the initial subsea module 2. Here, a further control device 10 is connected to the connection interface 2CI of the further subsea module 2. The further subsea module 10 is connected to the initial control module 10. Electrical power and communication signals is transferred to the further control device 10 via the initial control device 10 by means of one or more further jumpers 6. It should be noted that the further jumper can be connected to the first (i.e. via connection interface 2CI) or second connectors 30, 32 of the device 10 and to the first (i.e. via connection interface 2CI) or second connectors 30, 32 of the further device 10.

It is now referred to FIG. 14, illustrating an alternative embodiment of the control system 100 shown in FIG. 12. The control system 100 here comprises a further control module 10 connected to the same subsea module 12. The further control module 10 may here be used as redundancy, or for hot-swapping purposes. The further module 10 is here connected to the umbilical termination unit 5.

It is now referred to FIG. 15, illustrating an alternative embodiment of the control system 100 shown in FIG. 13. Here, there are one further control module 10 connected to the initial subsea module 2. The further control module 10 is here supplying electric power and communication to the further subsea module 2 (module 2 to the right in FIG. 15). In some installations, this would be preferred over a jumper 6 from the control module of the further subsea module 2 to the umbilical termination assembly 5.

Figure 16:
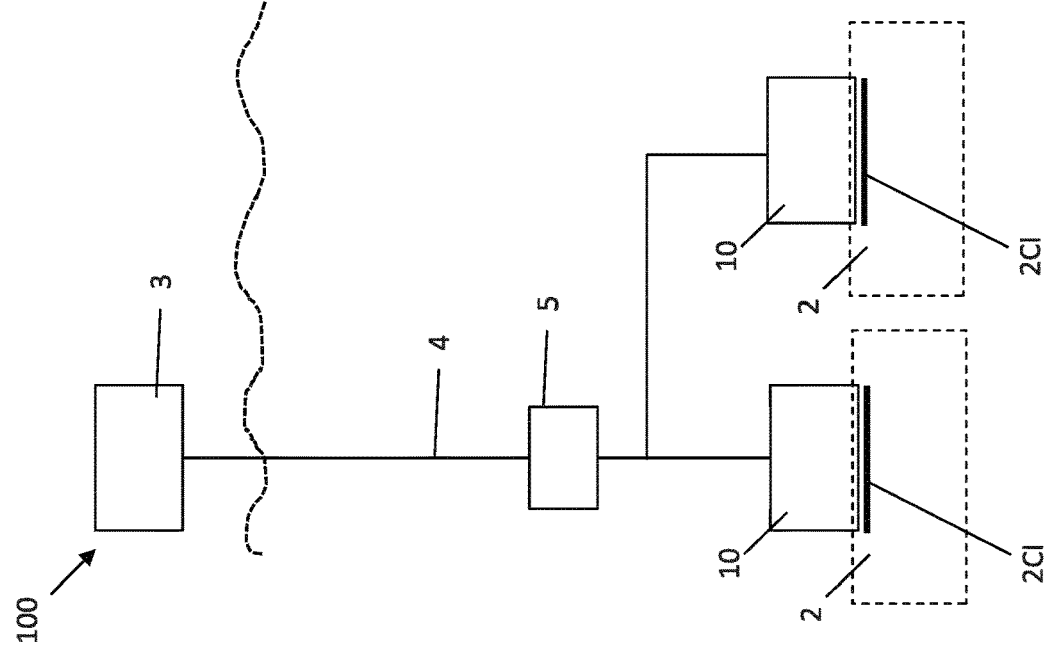

It is now referred to FIG. 16, illustrating a simple three structure with one control module 10 connected to each of two subsea modules 2.

Figure 17:
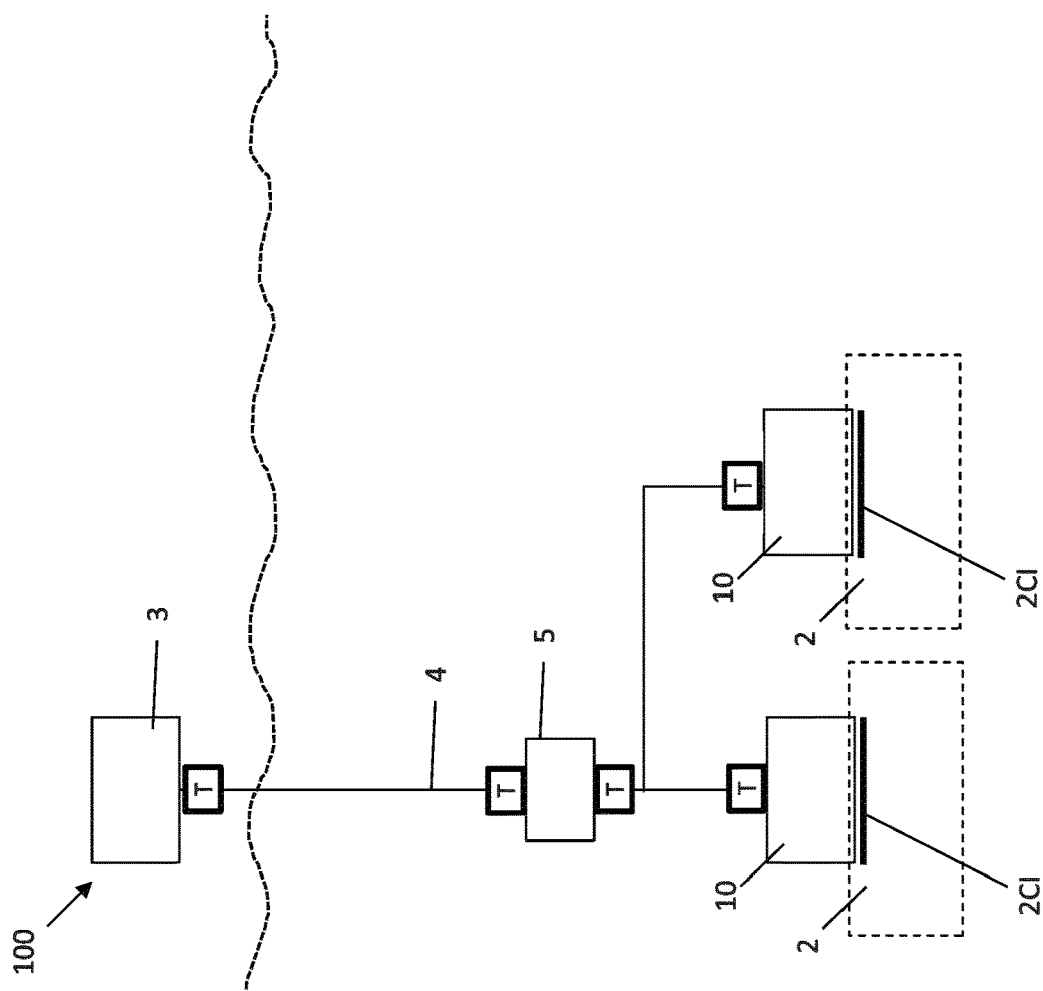

It is now referred to FIG. 17, corresponding substantially to FIG. 16. Here, step-up and step-down transformers are connected to each end of the umbilical and jumpers in order to reduce loss of energy in the umbilical and due to voltage drop in the power transmission through the jumper.

Figure 18:
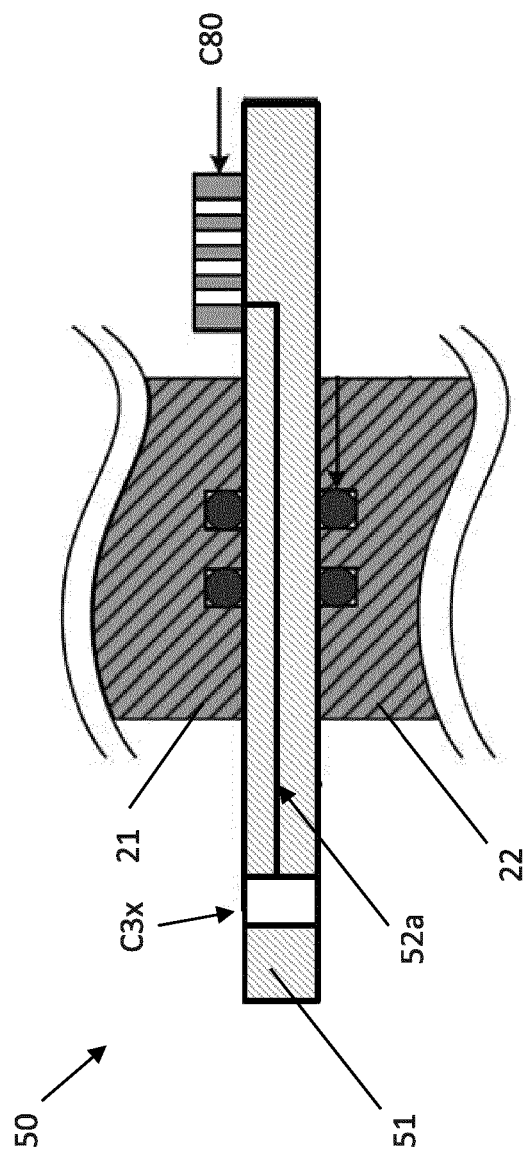
FIG. 18 illustrates an alternative embodiment of the inner connectors of the penetrator device.

It is now referred to FIG. 18. Here, the second inner connector C3x is connected as a press-fit connection interface in the printed circuit board 51. In such an embodiment, it is possible to connect the outer connector 30, 32 directly to the printed circuit board 51. In this way, the rectangular box illustrating the connector C3x in FIGS. 9 and 11 can be omitted, as the outer connector 3x of FIGS. 9 and 11 can be connected directly to the printed circuit board.

The same applies to the first inner connector C80. Accordingly, it is achieved that all connections to penetrator devices 50a and 50b are done directly without any soldering or manual wiring. Moreover, as shown in FIG. 18, the conductive tracks 52a may also be located within the printed circuit board, for example by using two layers of printed circuit board material. In this way, the upper and lower surfaces of the assembled printed circuit board 51 are smoother to achieve a better sealing towards the sealing devices 53, 54, 55.

In FIGS. 19-32, some reference numbers are drawn on the connectors of different types of modules which will be described more in detail below. These connector reference numbers are described in short below:

9: Standard Power/com primary side: AC or DC subsea field distribution voltage+Ethernet

10: Standard Power/com secondary side: Standard AC or DC subsea field distribution voltage+Ethernet

11: Optical Fiber interface

12: Standard Digital Interface to sensors and low voltage power. Primary and Secondary side in same interface.

13: Standard Digital Interface to sensors and low voltage power. Primary side only.

14: Wireless in seawater connection Ethernet interface internally

15: Power/com from UTH transmission voltage in main umbilical

16: Instrumentation Down hole interface

17: Hybrid interface; power on copper and communication on fiber

18: SIL level interface from Logic Solver to SIL sensors

19: Auxiliary proprietary or special interface

20: Battery High Power primary, intermediate consumers communication

21: Analog Motor Driver interface (3 motor phases and resolver position feedback)

22: Sensor or actuator (redundant)

27: SIL sensor or SIL actuator

It should be noted that the terms "primary" and "secondary" here refers to two independent sides with respect to redundancy.

Dashed lines are indicating communication lines and solid lines are indicating power lines or power/communication lines in these drawings.

It should be noted that all lower connectors preferably are stab connectors for connection to the connection interface 2CI of a subsea module, and the upper connectors preferably are ROV connectors for connection to the subsea module or to a control module 10 via a jumper. As is apparent, some of these modules have both upper and lower connectors, while others have either upper or lower connectors.

It is now referred to FIGS. 19 and 20, where two control modules 10 are shown. The control module 10 of FIG. 19 is a redundant control module, i.e. the redundancy is provided by having only one such control module. The control module 10 of FIG. 20 is a non-redundant control module, i.e. redundancy is provided by having two such control modules.

FIG. 21 illustrates a transformer module TM containing a transformer for transforming the power between a higher voltage and a lower voltage, for example 3 kV AC in and 900, 600 or 230 V out.

Figure 28:
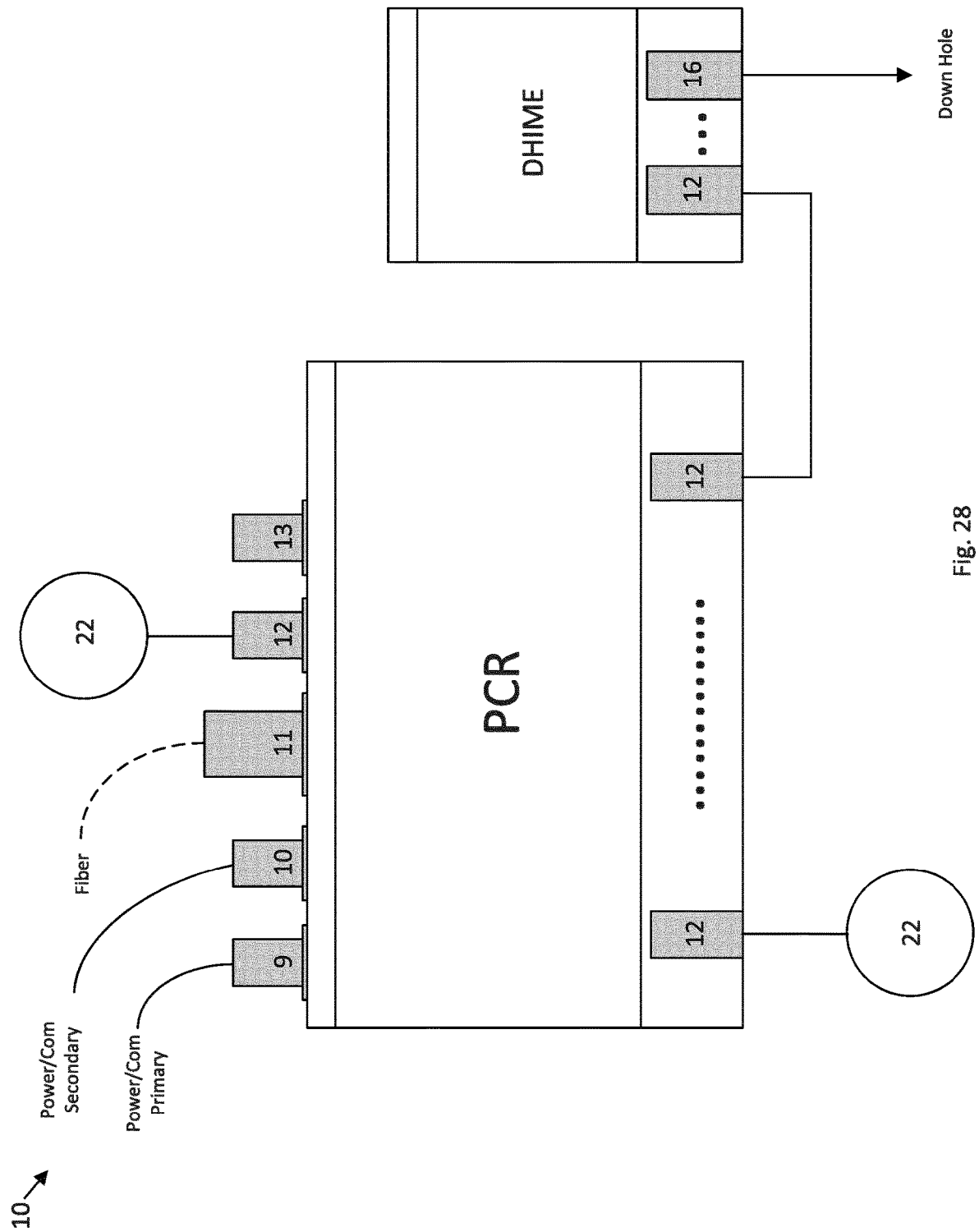
FIG. 28 illustrate a control module connected to a downhole interface module electric.

FIG. 22 illustrates a downhole interface electric module DHIME and FIG. 28 illustrate how this module is connected to a control module 10. The module DHIME is connected to a downhole unit, for example a downhole sensor. In this way, the hardware and software interface of the module 10 can be standardized, which enables the operator of the field to support different down hole equipment from different down hole equipment manufacturers with the same module.

Figure 29:
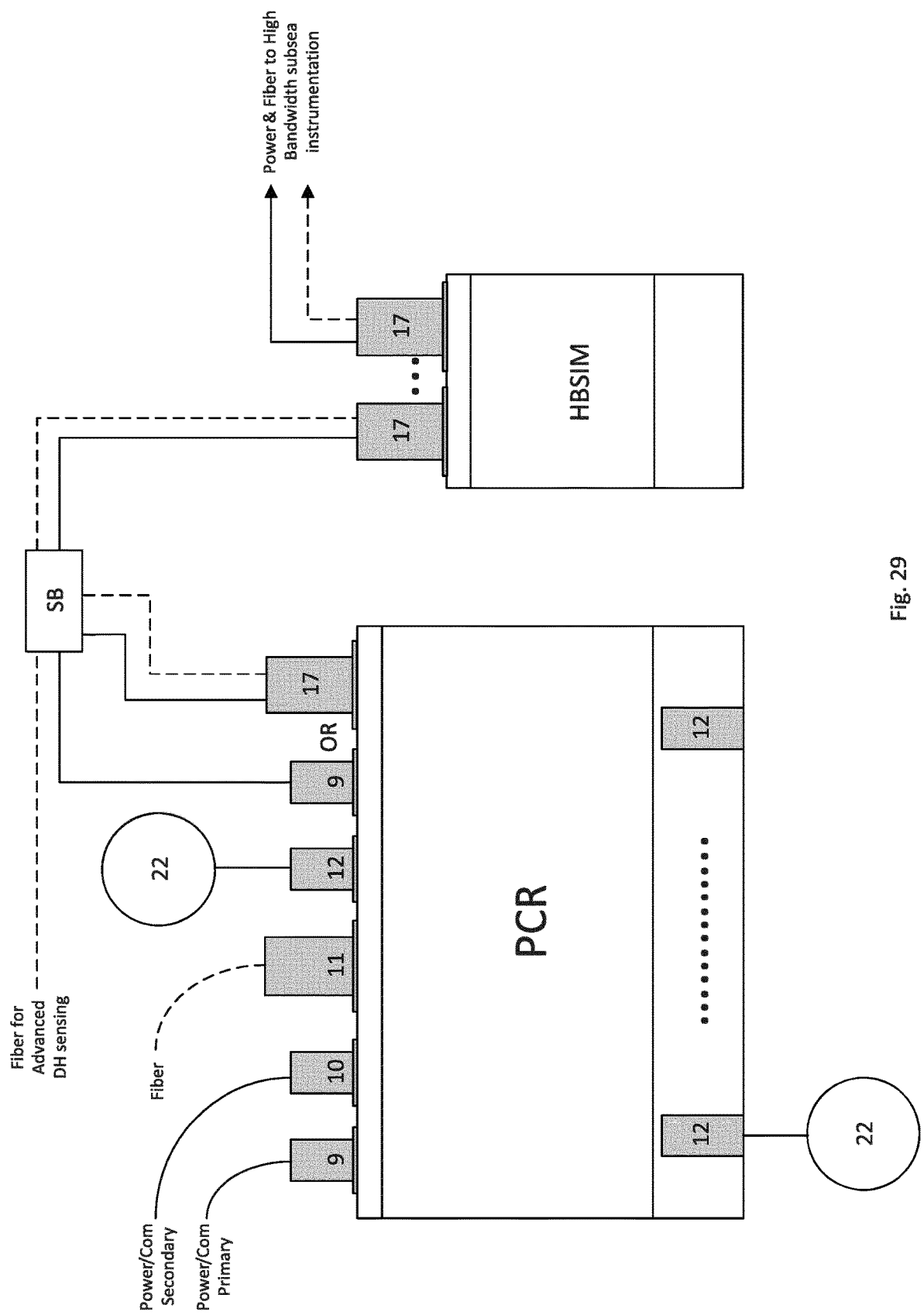
FIG. 29 illustrate a control module connected to a high bandwidth subsea instrumentation module.

FIG. 23 illustrates a high bandwidth subsea instrumentation module HBSIM and FIG. 29 illustrates how this module is connected to a control module 10. The module HBSIM is here connected to the control module 10 via a split box SB for merging power lines and fiber communication lines into one common jumper. The module HBSIM is typically used with fiber-based down hole sensors which typically requires more power and bandwidth than other equipment.

Figure 31:
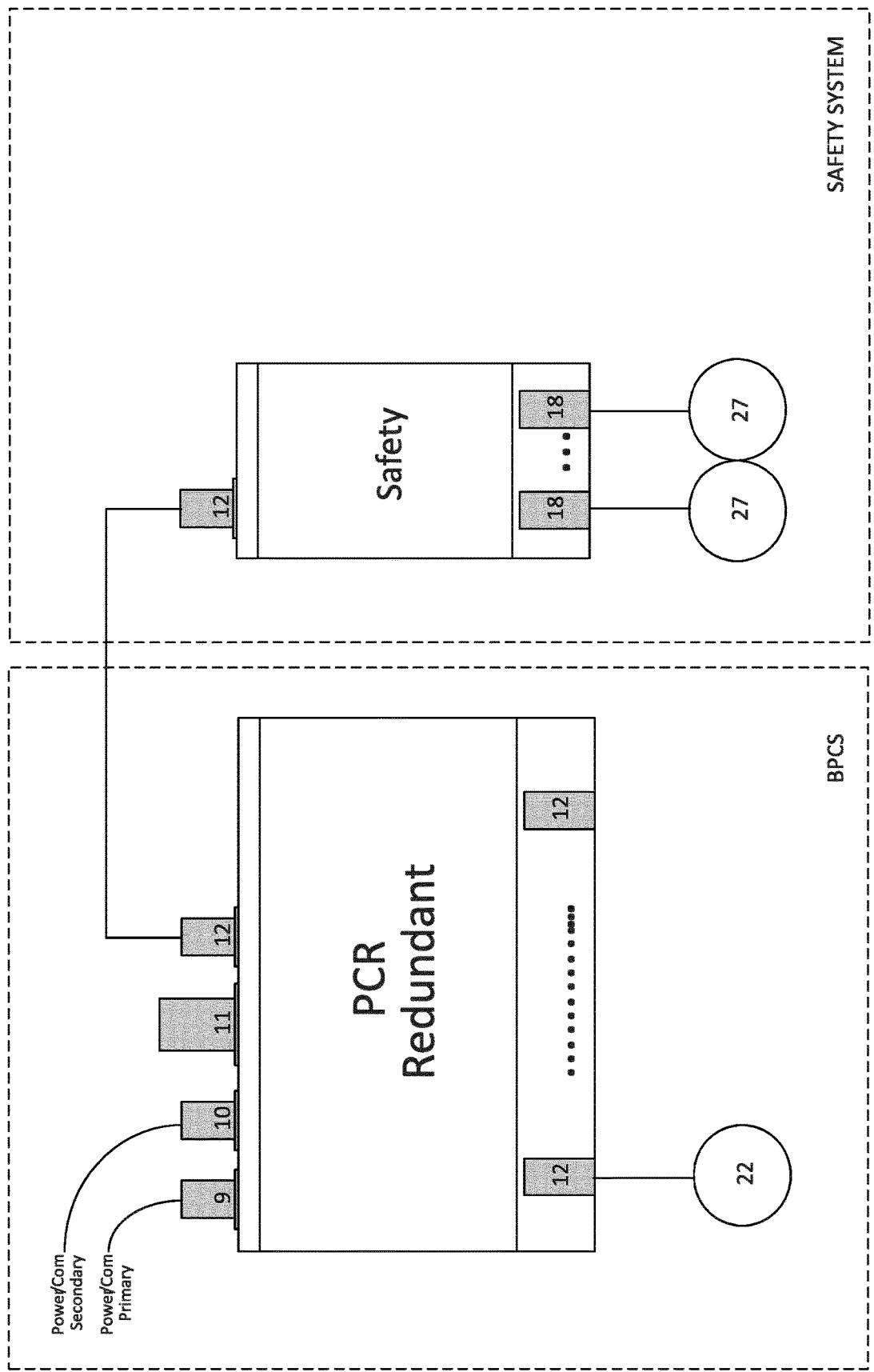
FIG. 31 illustrates a control module connected to a safety module.

FIG. 24 illustrates a safety module and FIG. 31 illustrates how this safety module is connected to a control module 10. The safety module is connected to SIL (Safety Integrity Level) sensors or SIL actuators within safety critical subsea systems for receiving information from such SIL sensor or to send signals to SIL actuators. In this way, it is achieved that the safety critical functions are separated from non-safety critical functions, which is desired in many subsea applications.

Figure 32:
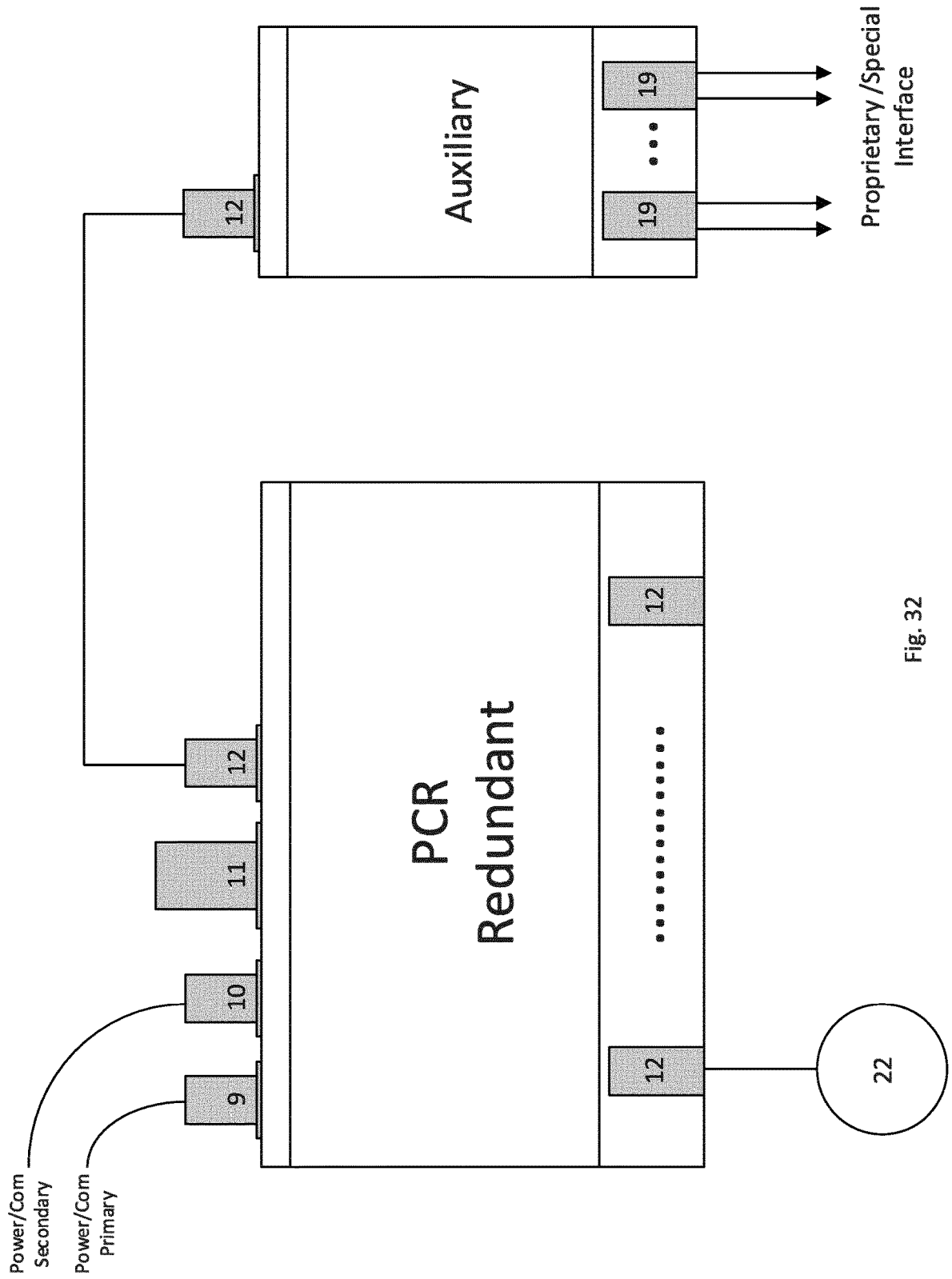
FIG. 32 illustrates a control module connected to an auxiliary module containing a proprietary or special connection interface.

FIG. 25 illustrates an auxiliary module and FIG. 32 illustrates how this auxiliary module is connected to a control module 10. The auxiliary module is connected to a proprietary connection interface or to a special connection interface of a subsea module. This example may be relevant when a subsea module having a proprietary connection interface shall be connected to a control system 100 which are using the control modules 10 described above. The auxiliary module may for example comprise converters for converting communication signal used by the control module to communication signal used by the proprietary connection interface or the special connection interface. Communication with, and supplying power to, such proprietary connection interfaces require engineering which will increase costs of control modules. Hence, by moving this functionality into a separate module, no extra engineering is required for the control module 10.

FIG. 26 illustrates a battery module comprising a preferably rechargeable battery. FIG. 27 illustrates a motor driver module containing electric circuits for controlling an electric motor, i.e. for supplying electric energy to a motor and for receiving sensor signals from the motor.

Figure 30:
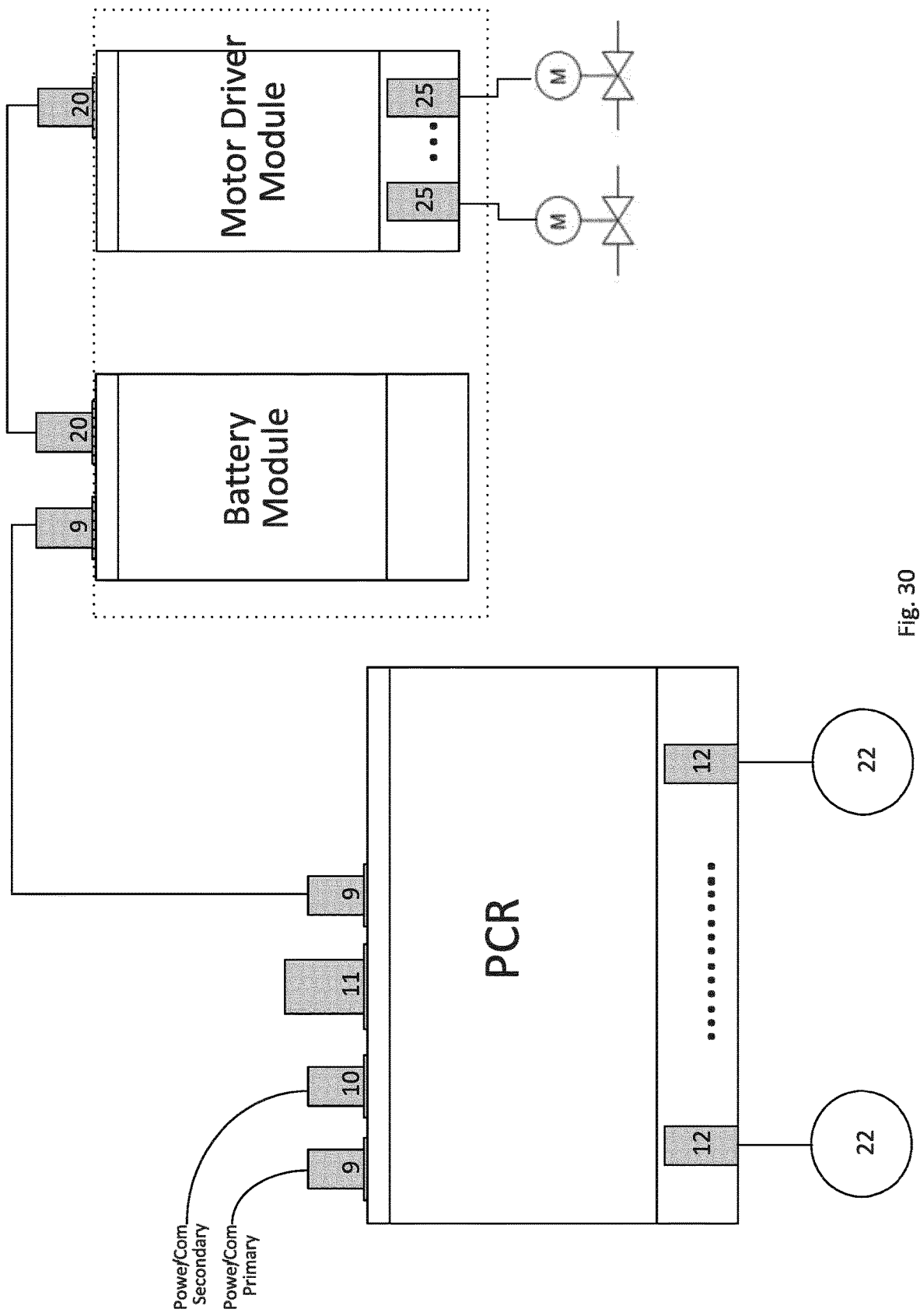
FIG. 30 illustrate a control module connected to a battery module and a motor driver module.

FIG. 30 illustrates how the above battery module and the above motor driver module are connected to a control module 10. It should be noted that the battery module and motor driver module may be two separate modules connected to the control module 10 or the battery module and motor driver module may be combined into one physical module (as indicated by dotted line in FIG. 30). Here, the lower connectors of the motor driver module is connected to one or more motors M. The upper connector is connected to the battery module and the battery module is connected to the control module 10.

Above, several types of special-purpose modules are described. One huge advantage is that even if the control module 10 is standardized into a relatively small unit, with a standard interface, all necessary additional functionality can be provided by using more than one such control module or by using such control module(s) together with the above special-purpose modules shown in FIGS. 21-27.

When comparing the prior art of FIG. 6 with the present invention of FIG. 7, size is considerably reduced. This can also be seen in FIG. 4, where the control module 10 is shown side by side with other prior art control modules.

The invention claimed is:

1. A subsea electric power and communication module for controlling a subsea module of a subsea oil/gas installation, the subsea electric power and communication module comprising:
   a housing comprising a pressure sealed main compartment;
   a first outer connector provided outside of the housing, the first outer connector being configured to be connected to a subsea module;
   a control device comprising electric power supply circuitry and/or communication circuitry provided within the pressure sealed main compartment;
   a first penetrator device connected between the first outer connector and the control device;
   wherein the first penetrator device comprises:
      a printed circuit board;
      a first sealing device for sealing off a first area of the printed circuit board, the first area being faced towards the main compartment;
      a first inner connector connected to the first area of the printed circuit board, the first inner connector being connected to the control device;
      a second sealing device for sealing off a second area of the printed circuit board, the second area being faced towards a pressure balanced compartment between the pressure sealed main compartment and an environment outside of the housing;
      a second inner connector connected to the second area of the printed circuit board, the second inner connector being connected to the first outer connector; and
      conductive tracks provided on the printed circuit board and connecting the first inner connector and the second inner connector.

2. The subsea electric power and communication module according to claim 1, wherein:
   the housing comprises a main housing unit and a connector housing unit;
   the first penetrator device is provided in a compartment between the main housing unit and the connector housing unit; and
   the first outer connector is provided through the connector housing unit.

3. The subsea electric power and communication module according to claim 1, where the main housing unit is made of aluminum or an aluminum alloy.

4. The subsea electric power and communication module according to claim 1, further comprising:
   a second penetrator device connected between a second outer connector and the control device; and
   a pressure alignment channel provided through the housing between the pressure balanced compartment of the first penetrator device and a pressure balanced compartment of the second penetrator device.

5. The subsea electric power and communication module according to claim 1, wherein the first penetrator device comprises a leakage sensor provided in the pressure balanced compartment, the leakage sensor is being electrically connected to the control device.

6. The subsea electric power and communication module according to claim 1, wherein the first penetrator device comprises:
   a first intermediate sealing device for sealing off a first intermediate area of the printed circuit board outside of the first area, the first intermediate area being faced towards a first intermediate compartment forming an additional barrier between the pressure sealed main compartment and the outside environment; and
   a pressure sensor for sensing the pressure in the first intermediate compartment, the pressure sensor is being electrically connected to the control device.

7. The subsea electric power and communication module according to claim 6, where the first penetrator device comprises:
   a second intermediate sealing device for sealing off a second intermediate area of the printed circuit board outside of the second area, the second intermediate area being faced towards a second intermediate compartment forming an additional barrier between the pressure sealed main compartment and the outside environment.

8. A control system for controlling a subsea module of a subsea oil/gas installation, the control system comprising:
   a connection interface provided on the subsea module;
   a topside control module;
   an umbilical connected between the topside control module and the connection interface; and
   a first subsea electric power and communication module according to claim 1 which is releasably connected to the connection interface.

9. The control system according to claim 8, further comprising:
   a further subsea module having a further connection interface; and
   a further subsea electric power and communication module connected to the further connection interface;
   where the subsea electric power and communication module is connected to the further subsea electric power and communication module for providing communication between the topside control module and the further subsea electric power and communication module via the subsea electric power and communication module.

* * * * *